US008419272B2

(12) United States Patent  
Higashi

(10) Patent No.: US 8,419,272 B2  
(45) Date of Patent: Apr. 16, 2013

(54) TEMPERATURE MEASURING DEVICE, THERMAL TREATMENT DEVICE USING THE SAME, TEMPERATURE MEASURING METHOD

(75) Inventor: Seiichiro Higashi, Higashihiroshima (JP)

(73) Assignee: Hiroshima University, Hiroshima-Ken (JP)

( * ) Notice: Subject to any disclaimer, the term of this patent is extended or adjusted under 35 U.S.C. 154(b) by 830 days.

(21) Appl. No.: 11/917,969

(22) PCT Filed: Jul. 4, 2006

(86) PCT No.: PCT/JP2006/313304
§ 371 (c)(1),
(2), (4) Date: Dec. 8, 2009

(87) PCT Pub. No.: WO2007/004644
PCT Pub. Date: Jan. 11, 2007

(65) Prior Publication Data
US 2010/0086006 A1    Apr. 8, 2010

(30) Foreign Application Priority Data
Jul. 5, 2005 (JP) .................... 2005-195691

(51) Int. Cl.
*G01K 1/00* (2006.01)
(52) U.S. Cl.
USPC ............ 374/120; 374/130; 374/137; 702/130
(58) Field of Classification Search .................. 374/120, 374/130, 134, 137; 702/130, 134
See application file for complete search history.

(56) References Cited

U.S. PATENT DOCUMENTS

| 5,004,913 A * | 4/1991 | Kleinerman ............. 250/227.21 |
| 2005/0092924 A1* | 5/2005 | Secundo et al. ............... 250/331 |
| 2006/0233216 A1 | 10/2006 | Schuele |
| 2008/0304543 A1* | 12/2008 | Abe et al. ...................... 374/120 |

FOREIGN PATENT DOCUMENTS

| JP | 11-190670 | 7/1999 |
| JP | 2000-162048 | 6/2000 |
| WO | 2004/065923 | 8/2004 |

* cited by examiner

*Primary Examiner* — Mirellys Jagan
(74) *Attorney, Agent, or Firm* — Greenblum & Bernstein, P.L.C.

(57) ABSTRACT

A temperature measuring apparatus and a temperature measuring method, comprising a light intensity measuring unit, a calculation unit, and a temperature output unit; wherein an object to be heated having a uniquely defined correlation between temperature and refractive index is irradiated with a probe laser beam in the light intensity measuring unit, and a light intensity property is determined which represents a relationship between time and light intensity of a reflected light or a transmitted light occurring as a result of interference of the multiply-reflected probe laser beam within the object to be heated. In the calculation unit, a virtual object to be heated having equivalent dimensional, thermal, and optical characteristics to those of the object to be heated is subjected to a thermal incidence equivalent to the heating conditions of the object to be heated. A light intensity property of the virtual object to be heated is irradiated with a probe laser beam having an equivalent property to said probe laser beam is acquired, and a virtual object to be heated having a light intensity property is obtained as a replicated object to be heated. The temperature output unit acquires temperature of the object to be heated at a predetermined position thereon at a predetermined time on the basis of the replicated object to be heated.

19 Claims, 11 Drawing Sheets

_US 8,419,272 B2_

TEMPERATURE MEASURING DEVICE, THERMAL TREATMENT DEVICE USING THE SAME, TEMPERATURE MEASURING METHOD

TECHNICAL FIELD

The present invention relates to a temperature measuring apparatus for performing temperature measurement using a laser, and to a thermal treatment apparatus and a temperature measuring method which adopt the temperature measuring apparatus. In particular, the invention relates to a temperature measuring apparatus which is suitably used for temperature measurement in the case, for example, a thermal treatment of a substrate, such as a semiconductor substrate, where a thermal treatment is conducted in a short period of time by creating a high temperature gradient within the substrate, and to a thermal treatment apparatus and a temperature measuring method which adopts this temperature measuring apparatus.

BACKGROUND ART

In a thermal treatment of a substrate, such as a semiconductor substrate, it is required to have a noncontact method for measuring the substrate temperature in order to perform a highly-accurate, highly-efficient thermal treatment. A radiation thermometer has been commonly used as a noncontact temperature measuring apparatus. However, it is difficult to accurately measure the temperature of a substrate with the radiation thermometer due to the emissivity varying according to the condition of the substrate surface. Thus, a method for measuring the temperature of a substrate using a laser has been proposed.

For example, Patent Document 1 proposes a method for determining the temperature of an object of temperature measurement. The method includes the steps of: irradiating both the object of temperature measurement and a reference member with a probe laser beam emitted from a semiconductor laser; detecting a synthesized light of a reflected light from the object of temperature measurement and a reflected light from the reference member; acquiring, from the spectrum of the synthesized light, the frequency of a light component which specifically exhibits a variation in intensity in response to the temperature of the object of temperature measurement; and thereby determining the temperature of the object of temperature measurement on the basis of the frequency.

Patent Document 2 proposes a method for temperature measurement by using a surface temperature measuring apparatus. The surface temperature measuring apparatus for measuring the surface temperature of a work object includes the following units: a probe laser beam irradiation unit for irradiating a measurement point on the work object with a probe laser beam; a probe laser beam separation unit for separating the probe laser beam radiated from the probe laser beam irradiation unit, and then radiating the separated probe laser beams in parallel on the measurement point on the work object and a reference point located a predetermined distance from the measurement point; a pulse laser beam irradiation unit for heating the measurement point intermittently by radiating a pulse laser beam on the measurement point; an interferometer for detecting interference by collecting reflected lights reflected from the measurement point and the reference point; and a calculation unit for calculating the temperature of the measurement point on the basis of the frequency of an ultrasonic oscillation at the measurement point which has been obtained by the interferometer.

Patent Document 1: Japanese Patent Application Laid-open Publication No. 2000-162048
Patent Document 2: Japanese Patent Application Laid-open Publication No. Hei 11-190670

DISCLOSURE OF THE INVENTION

Problem to be Solved by the Invention

These methods are, however, for measuring the temperature of a substrate in a thermal treatment in which the substrate is heated in a furnace to keep the temperature throughout the whole substrate constant; thus, they are not suitable for temperature measurement in the case where a thermal treatment is conducted in a short period of time by creating a high temperature gradient within a substrate, such as a thermal treatment in which a substrate is rapidly heated on the surface with the use of a heat source having a high power density. As for the method proposed in Patent Document 1, it is difficult to adopt the method for an amorphous substrate, such as glass, since the method is based on probe laser beam modulation caused by lattice vibration. Furthermore, involving a spectrum analysis of a minute noise, the method has low temporal resolution; thus, it is difficult to conduct temperature measurement by using this method on a substrate which exhibits rapid temperature changes. Hence, it is required to develop a temperature measuring apparatus or a temperature measuring method which is capable of measuring temperature of the surface or the inside of a substrate exhibiting rapid temperature changes in the range of milliseconds.

In view of such a request, the present invention aims to provide a temperature measuring apparatus and a temperature measuring method which are capable of measuring the temperature of a substrate at a predetermined position thereon at a predetermined time in the case where a thermal processing is conducted by rapidly heating the surface of the substrate with the use of a heat source having a high power density. The present invention also aims to provide a thermal treatment apparatus which is capable of conducting a thermal treatment under an accurate temperature control with the use of the above-described temperature measuring apparatus.

Means of Solving Problems

The inventor focused his attention on the fact that the problem of unstable control over film thickness in a film formation process while having the thickness monitored with a highly coherent probe laser beam is attributable to the event in which the intensity of the received probe laser beam periodically changes as a film-forming substrate is heated during the film-forming process. Then, upon irradiating a substrate with a probe laser beam in a thermal treatment of the substrate using a plasma jet, the intensity of a reflected probe laser beam was measured. As a result, observing that the temporal change profile of the reflectivity of the probe laser beam thus obtained was corresponding with the change profile of the refractive index based on a temperature distribution caused within the substrate by rapid heating of the substrate surface, the inventor completed the present invention.

A temperature measuring apparatus according to the present invention includes: a light intensity measuring unit; a calculation unit; and a temperature output unit. In the light intensity measuring unit, an object to be heated having a uniquely defined correlation between temperature and refractive index is irradiated with a probe laser beam, resulting in the probe laser beam multiply-reflected within the object to be heated, and thereby a light intensity property X is determined which represents the relationship between time and light intensity of a reflected light or a transmitted light occurring as a result of interference of the multiply-reflected probe laser beam. In the calculation unit, which is for acquisition of a replicated object to be heated, a virtual object to be heated having equivalent dimensional, thermal, and optical characteristics to those of the object to be heated is subjected to a thermal incidence equivalent to the heating conditions for the object to be heated, and, as a replicated object to be heated, a virtual object to be heated having a light intensity property Z which is obtained by irradiating the object to be heated with a probe laser beam having equivalent characteristics to the above-described probe laser beam and is closest to the light intensity property X is acquired. The temperature output unit determines the temperature of the heated object at a predetermined position thereon at a predetermined time on the basis of the replicated heated object.

The calculation unit in the above-described invention includes: a data input section; a thermal conduction analysis section; a conversion section; an optical analysis section; a judgment section; and a replicated object to be heated output section. The data input section inputs predetermined input data. The thermal conduction analysis section determines a temperature distribution profile of the virtual object to be heated on the basis of the input data. The conversion section converts the temperature distribution profile thus obtained into a corresponding refractive index distribution. The optical analysis section determines a predetermined optical property Y of a virtual object to be heated having the converted refractive index distribution. The judgment section extracts a predetermined optical property X from the light intensity property X, evaluates the difference between the optical properties X and Y, re-inputs a corrected initial value into a data input section so that the difference can be minimized, and thereby determines an optical property Z closest to the optical property X. The replicated object to be heated output section outputs, as a replicated object to be heated, a virtual object to be heated having a light intensity property Z and a temperature distribution profile which correspond to the optical property Z.

Furthermore, in the temperature measuring apparatus described above, the optical property indicates any one of an optical thickness property obtained for the virtual object to be heated and a light intensity property obtained for the object to be heated and the virtual object to be heated including a property regarding a frequency, a phase, and peak to valley periods of a waveform.

The judgment section can be provided with a pattern recognition section for identifying the difference between the light intensity property X and the light intensity property Y by any one of a pattern matching method, a feature-point matching method, and a frequency analysis method. The judgment section can be provided with a mean squared error calculation section for evaluating the difference between the optical thickness property X and the optical thickness property Y by a mean squared error method.

The light intensity measuring unit can be provided with a probe laser beam source, a beam splitter, a laser condenser lens, and a light intensity detector. It is preferred that the relationship between the focal length f and the thickness d of an object to be heated is f>2d in the laser condenser lens.

The above-described invention can be suitably used as a temperature measuring apparatus determining the temperature varying from room temperature to 3000 K. within the time ranging from 1 µs to 10 s regarding an object to be heated.

The temperature measuring apparatus according to the present invention provided to a plasma jet generator allows high-quality performance, such as a thermal treatment of a semiconductor substrate. It is preferred that the thermal treatment apparatus be provided with a controller which controls output of the plasma jet generator on the basis of a signal from the temperature measuring apparatus.

The temperature measuring method according to the present invention includes the following steps. An object to be heated having a definite correlation between temperature and refractive index is irradiated with a probe laser beam, resulting in the probe laser beam multiply-reflected inside of the object to be heated. Thus, a light intensity property X representing the relationship between time and light intensity of a reflected light or a transmitted light occurred as a result of interference of the multiply-reflected probe laser beam is determined. In the next step, firstly, a temperature distribution profile of a virtual object to be heated having equivalent dimensional, thermal, and optical characteristics to those of the above-described object to be heated is determined upon applying thereon a thermal incidence, which has equivalent conditions to those for heating of the object to be heated, and thereafter a refractive index distribution profile corresponding to the temperature distribution profile is determined. A light intensity property Y obtained from irradiation of a virtual object to be heated having the refractive index distribution profile described above with a probe laser beam having equivalent characteristics to the above-mentioned probe laser beam is acquired. Then, the difference between the light intensity property Y and the light intensity property X is evaluated. Next, a corrected light intensity property is determined by correcting a predetermined condition among thermal incidence conditions applied to the virtual object to be heated. Thereby, as a replicated object to be heated, a virtual object to be heated is acquired which has a corrected light intensity property Z which has the minimum difference with the light intensity property X, and a temperature distribution profile corresponding to the light intensity property Z thus acquired. Lastly, the temperature of the object to be heated at a predetermined position thereon at a predetermined time is determined on the basis of the temperature distribution profile of the replicated object to be heated.

In the invention of the temperature measuring method, it is preferable that a predetermined condition among the thermal incidence conditions be a power transfer efficiency and/or the size of a region in a virtual object to be heated in which the virtual object to be heated effectively receives an input power.

A temperature measuring program according to the present invention includes the following programs. A program is for acquiring a light intensity property X representing the relationship between time and light intensity of any one of a reflected light and a transmitted light occurring as a result of interference of probe laser beam multiply-reflected within an object to be heated. The probe laser beam multiply-reflected within an object to be heated in this case is caused by radiation of a probe laser beam on the object to be heated having a uniquely defined correlation between temperature and refractive index. A thermal conduction analysis program is for acquiring a temperature distribution profile when a virtual object to be heated having equivalent dimensional, thermal, and optical characteristics to those of the object to be heated is subjected to a thermal incidence equivalent to the heating conditions for the object to be heated. A program is for acquiring a refractive index distribution profile corresponding to the temperature distribution profile. An optical analysis program is for acquiring a light intensity property Y, which is obtained when a virtual object to be heated having the refractive index distribution profile is irradiated with a probe laser beam having equivalent characteristics to those of the probe laser beam above. A program is for acquiring a light intensity property Z having the smallest difference with the light intensity property X upon evaluating the difference between the light intensity property X and the light intensity property Y, and correcting a predetermined condition among conditions of the thermal incidence to minimize the difference. A program is for acquiring, as a replicated object to be heated, a virtual object to be heated having the light intensity property Z and a temperature distribution profile corresponding thereto. A program is for acquiring the temperature of the object to be heated at a predetermined position thereon at a predetermined time on the basis of the temperature distribution profile of the replicated object to be heated.

A computer-readable recording media according to the present invention stores the following programs. A program is for determining a light intensity property X representing the relationship between time and light intensity of a reflected light or a transmitted light occurring as a result of interference of multiply-reflected probe laser beam within an object to be heated. The multiply reflected probe laser beam within an object to be heated in this case is caused by radiation of a probe laser beam on the object to be heated having a definite correlation between temperature and refractive index. A thermal conduction analysis program is for determining a temperature distribution profile when a virtual object to be heated having equivalent dimensional, thermal, and optical characteristics to those of the above-described object to be heated is subjected to a thermal incidence equivalent to the heating conditions for the object to be heated. A program is for determining a refractive index distribution profile corresponding to the temperature distribution profile. An optical analysis program is for determining a light intensity property Y which is obtained when a virtual object to be heated having the refractive index distribution profile is irradiated with a probe laser beam having equivalent characteristics to those of the above-mentioned probe laser beam. A program is for determining a light intensity property Z having the smallest difference with the light intensity property X upon evaluating the difference between the light intensity property X and the light intensity property Y, and correcting a predetermined condition among thermal incidence conditions to minimize the difference. A program is for acquiring, as a replicated object to be heated, a virtual object to be heated having the light intensity property Z and a temperature distribution profile corresponding thereto. A program is for determining the temperature of the object to be heated at a predetermined position thereon at a predetermined time on the basis of the temperature distribution profile of the replicated object to be heated.

An LSI according to the present invention for temperature measurement performs temperature measurement by executing the following programs. A program is for determining a light intensity property X representing the relationship between time and light intensity of a reflected light or a transmitted light occurring as a result of interference of multiply-reflected probe laser beam inside of an object to be heated. The multiply reflected probe laser beam inside of an object to be heated in this case is caused by radiation of a probe laser beam on the object to be heated having a uniquely defined correlation between temperature and refractive index. A thermal conduction analysis program is for determining a temperature distribution profile when a virtual object to be heated having equivalent dimensional, thermal, and optical characteristics to those of the above-described object to be heated is subjected to a thermal incidence equivalent to the heating conditions for the object to be heated. A program is for determining a refractive index distribution profile corresponding to the temperature distribution profile. An optical analysis program is for determining a light intensity property Y which is obtained when a virtual object to be heated having the refractive index distribution profile is irradiated with a probe laser beam having equivalent characteristics to those of the above-mentioned probe laser beam. A program is for determining a light intensity property Z having the smallest difference with the light intensity property X upon evaluating the difference between the light intensity property X and the light intensity property Y, and correcting a predetermined condition among thermal incidence conditions to minimize the difference. A program is for acquiring, as a replicated object to be heated, a virtual object to be heated having the light intensity property Z and a temperature distribution profile corresponding thereto. A program is for determining the temperature of the object to be heated at a predetermined position thereon at a predetermined time on the basis of the temperature distribution profile of the replicated object to be heated.

In the temperature measuring apparatus or the method described above, it takes an extremely short period of time from the acquisition of a light intensity property X of an object to be heated to the acquisition of a replicated object to be heated, and further to the acquisition of temperature at a predetermined position of an object to be heated at a predetermined time. There is no significant difference between the temperature measuring apparatus or the method and a regular temperature measuring method. However, by providing a database accumulating data regarding a light intensity property X and the corresponding replicated object to be heated in advance, it is possible to achieve high-speed temperature measurement, and to obtain a temperature measurement apparatus having a compact size and a simple configuration, for example.

The database according to the present invention includes an input section, a storage section, and a retrieve section. The input section inputs data for selection of a subject to be measured. A storage section stores a data group representing a light intensity property being calculated in advance on the basis of predetermined initial values of the subject being able to be input into the input section, and on the basis of a corrected value which is obtained by modifying a specific initial value among the initial values, and a group of data representing a replicated object to be heated having a temperature distribution profile corresponding to the above-described data group. The retrieve section retrieves a light intensity property Z which is closest to the light intensity property X obtained from the data groups representing light intensity properties and replicated objects to be heated according to an object to be heated, and for retrieving a replicated object to be heated corresponding to the light intensity property Z.

Based on such database, it is possible to make up a temperature measuring apparatus having a compact and simple configuration. To be more specific, the temperature measuring apparatus includes a light intensity measuring unit, a database, and a temperature output apparatus. In the light intensity measuring unit, an object to be heated having a uniquely defined correlation between temperature and refractive index is irradiated with a probe laser beam, resulting in the probe laser beam multiply-reflected within the object to be heated, and then a light intensity property X is determined which represents the relationship between time and light intensity of a reflected light or a transmitted light occurring as a result of interference of the probe laser beam multiply-reflected within the object to be heated. The database includes: an input section for inputting data for selection of a subject to be measured; a storage section for storing a group of data representing a light intensity property being calculated in advance on the basis of predetermined initial values of the subject being able to be input into the input section, and on the basis of a corrected value which is obtained by modifying a specific initial value among the initial values, and a group of data representing a replicated object to be heated having a temperature distribution profile corresponding to the above-described data group; and a retrieve section for retrieving a light intensity property Z which is closest to the light intensity property X obtained from the data groups representing light intensity property and replicated object to be heated according to the object to be heated, and for retrieving a replicated object to be heated corresponding to the light intensity property Z. The temperature output apparatus determines the temperature of the object to be heated at a predetermined position thereon at a predetermined time on the basis of the replicated object to be heated.

The temperature measuring apparatus according to the present invention may have the following configuration by including: a light intensity property acquisition unit for an object to be heated; a temperature characteristic acquisition unit for a virtual object to be heated; a refractive index property acquisition unit for a virtual object to be heated; a light intensity property acquisition unit for a virtual object to be heated; a replicated object to be heated identification unit; and a temperature acquisition unit for an object to be heated. The light intensity property acquisition unit for an object to be heated acquires a first light intensity property representing the relationship between time and light intensity of interference wave which is obtained by irradiating an object to be heated having a uniquely defined correlation between refractive index and temperature at a specific position with a predetermined probe laser beam. The temperature characteristic acquisition unit for a virtual object to be heated acquires a temperature distribution profile at a time when a first virtual object to be heated having equivalent dimensional, thermal, and optical characteristics to the above-described object to be heated is subjected to a thermal incidence having the conditions equivalent to those in heating of the object to be heated. The refractive index property acquisition unit for a virtual object to be heated acquires a refractive index property corresponding to the temperature distribution profile of the virtual object to be heated. The light intensity property acquisition unit for a virtual object to be heated acquires a second light intensity property representing the relationship between time and light intensity of interference wave which is obtained by irradiating a second virtual object to be heated having a refractive index equivalent to that of the above-described virtual object to be heated. The replicated object to be heated identification unit specifies a replicated object to be heated having a third light intensity property which is in the closest agreement with the first light intensity property on the basis of the first light intensity property and the second light intensity property. The temperature acquisition unit for an object to be heated acquires the temperature of the object to be heated at a specific position on the basis of the temperature distribution property of the replicated object to be heated.

Furthermore, in the identification unit for a replicated object to be heated of the temperature measuring apparatus according to the present invention, the third light intensity property may be acquired by adjusting the optical thickness property of the second virtual object to be heated so that the difference of the frequency of the wave profiles obtained from the first light intensity property and the second light intensity profile can be minimized.

Effect of the Invention

The temperature measuring method or the temperature measuring apparatus of the present invention are capable of easily and accurately measuring the temperature of a substrate at a predetermined position thereon in a thermal treatment in which the substrate is rapidly heated from the surface with a heat source having a high power density. The thermal treatment apparatus of the present invention has a simple and compact configuration. Furthermore, the thermal treatment apparatus of the present invention is capable of performing a thermal treatment with high stability in the treatment temperature on a substrate by measuring the temperature of the substrate in a desired minute part and by adjusting the conditions for thermal treatment on the basis of the temperature thus measured.

DESCRIPTION OF SYMBOLS

10 Object to be Heated
20 Probe Laser Beam
22 Reflected Probe Laser Beam
50 Plasma Jet Generator
51 Plasma Jet
100 Light Intensity Measuring Unit 105 Probe Laser Beam Source
106 Beam Splitter
107 Laser Condenser Lens
108 Light Intensity Detector
109 Filter
200 Calculation Unit
210 Data Input Section
220 Thermal Conduction Analysis Section
230 Conversion Section
240 Optical Analysis Section
250 Judgment Section
260 Replicated Object to be Heated Output Section
300 Temperature Output Unit

DETAILED DESCRIPTION OF THE PREFERRED EMBODIMENTS

Figure 1:
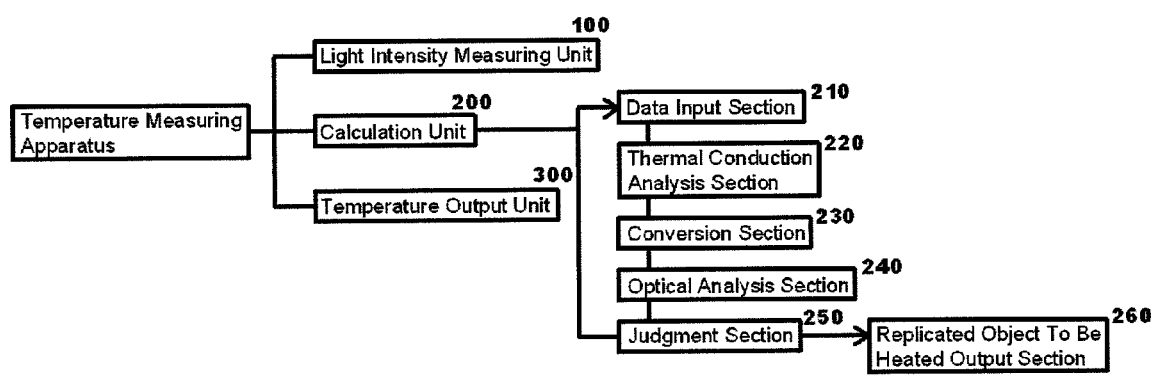
FIG. 1 is an explanatory drawing showing a configuration of a temperature measuring apparatus according to the present invention.

An embodiment of the temperature measuring apparatus according to the present invention will be described in detail in the following section. As shown in FIG. 1, the temperature measurement apparatus of the present invention includes: a light intensity measurement unit 100; a calculation unit 200; and a temperature output unit 300. The light intensity measurement unit 100 has a function for radiating a probe laser beam on an object to be heated having a uniquely defined correlation between temperature and refractive index, and for measuring a light intensity property X representing the relationship between time and the light intensity of a reflected light or a transmitted light occurring as a result of interference of a probe laser beam multiply-reflected within the object to be heated. Thus, the light intensity measurement unit 100 functions as the light intensity property acquisition unit for an object to be heated. The calculation unit 200 has a function for acquisition of a replicated object to be heated. In the function, a virtual object to be heated having equivalent dimensional, thermal, and optical characteristics to those of the object to be heated is subjected to a thermal incidence equivalent to the heating conditions for the object to be heated. Then, as a replicated object to be heated, a virtual object to be heated having a light intensity property Z which is obtained by irradiating the object to be heated with a probe laser beam having equivalent characteristics to the above-described probe laser beam and is closest to the light intensity property X is acquired. The temperature output unit 300 has a function for determining the temperature of the object to be heated at a predetermined position thereon at a predetermined time on the basis of the replicated object to be heated. It should be noted that, when various properties are referred in the present invention, denotations X, Y, and Z indicate properties regarding an object to be heated, a virtual object to be heated, and a replicated object to be heated, respectively.

Figure 2:
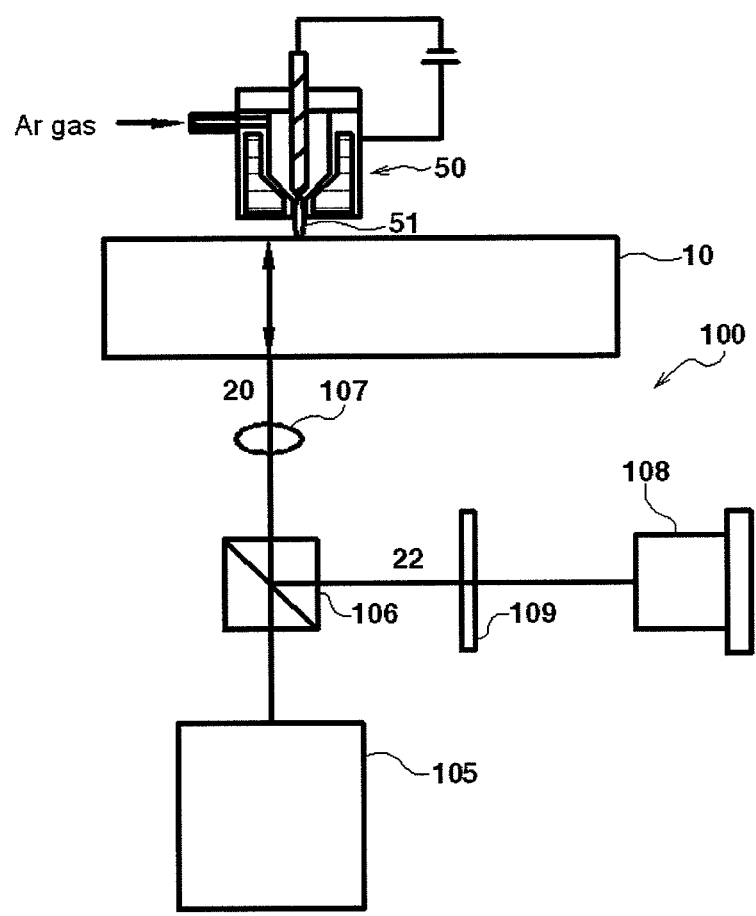
FIG. 2 is a layout chart showing an outline of a thermal treatment apparatus equipped with a temperature measuring apparatus shown in FIG. 1.

The light intensity measurement unit 100 is formed, for example, by the measuring apparatus shown in FIG. 2. This example demonstrates the case where the above-described temperature measuring apparatus is adopted in the configuration of a thermal treatment apparatus which conducts a thermal treatment of an object to be heated 10 with a plasma jet 51 from a plasma generator 50. The light intensity measuring unit 100 includes a probe laser beam source 105, a beam splitter 106, a laser condenser lens 107, a filter 109, and a light intensity detector 108.

Figure 3:
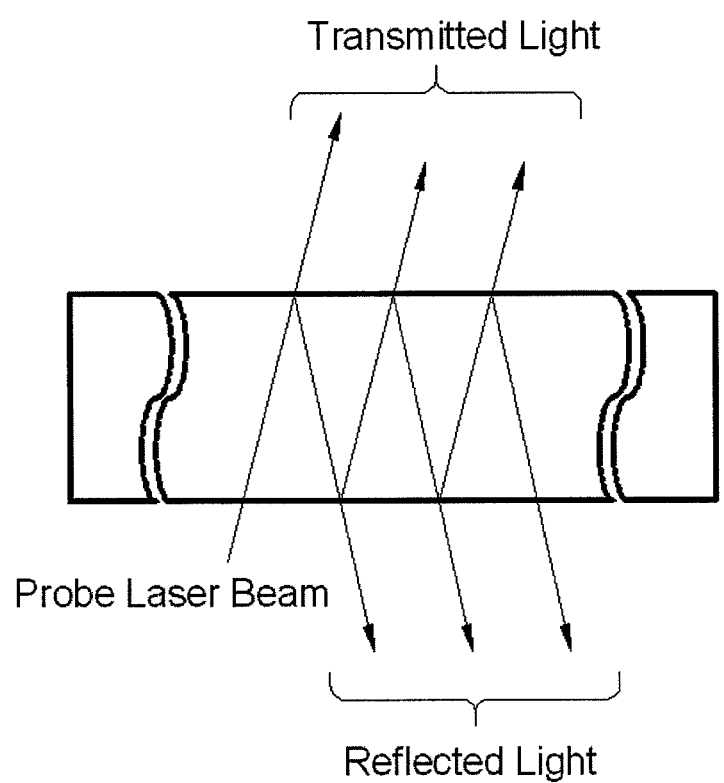
FIG. 3 is an explanatory drawing showing a multiple reflection condition of a probe laser beam radiated on an object to be heated.

In a thermal treatment of the object to be heated 10 using this thermal treatment apparatus, once the bottom surface of the object to be heated 10 is irradiated with a probe laser beam 20 from the probe laser beam source 105 coming through the beam splitter 106 and the laser condenser lens 107, the radiated probe laser beam 20 is multiply reflected on both sides of the object to be heated 10, as shown in FIG. 3. The resulting interference probe laser beam 22 enters the light intensity detector 108 through the beam splitter 106 and the filter 109. The light intensity detector 108 measures and records a light intensity property X representing the relationship between light intensity and time shown in FIG. 4.

Figure 4:
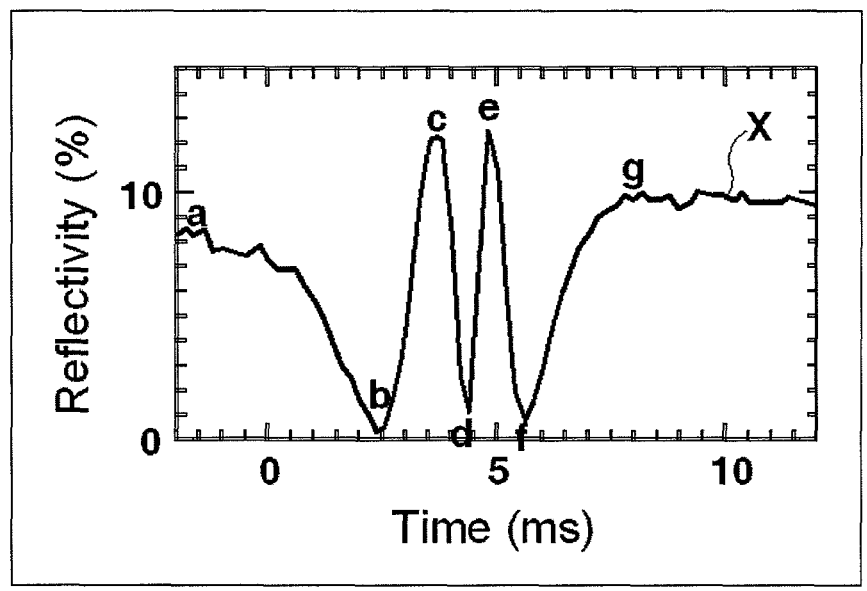
FIG. 4 is a graph of a light intensity property X representing the relationship between time and light intensity of a reflected light occurring as a result of interference of a multiply-reflected probe laser beam, which is obtained by radiation of a probe laser beam on an object to be heated, within the object to be heated.

In detail, FIG. 4 was obtained in a thermal treatment of a quartz substrate having the thickness of 525 μm using a plasma jet with an electric power input of 1.67 kW and a scanning speed of 700 mm/s by measuring the intensity of reflected probe laser beam (probe laser beam 22) which is reflected on both surfaces of the quartz substrate while a He—Ne probe laser beam having an electric power output of 10 mW and a wavelength of 633 nm is perpendicularly radiated from the bottom surface of the quartz substrate. In FIG. 4, the horizontal axis represents time after the initiation of the thermal treatment, and the vertical axis represents the reflectivity (relative light intensity) obtained based on the ratio of the intensity of the reflected probe laser beam 22 and the intensity of the incident probe laser beam 20. In this case, the transmittance obtained from the intensity of transmitted light to the top surface of the quartz substrate could also be used; however, it is practically preferable to adopt reflectivity in consideration of the configuration and operation of the apparatus.

As shown in FIG. 4, the reflectivity repeatedly fluctuates according to an elapsed time in the thermal treatment, and the light intensity property X exhibits an oscillatory waveform. The present invention utilizes such a light intensity property X to determine a temperature distribution and a temperature change state of an object to be heated. Therefore, in the present invention, while it is sufficient to have the object to be heated 10 having a uniquely defined correlation between temperature and refractive index, it is necessary to have an incident light and a multiply-reflected probe laser beam interfering with each other to a degree of causing a resulting interference wave to exhibit an oscillatory waveform. For this reason, it is preferable that the object to be heated 10 have more than two surfaces approximately parallel, and that the parallelism tolerance be within 5°. It is also preferable that the object to be heated have a laser transmittance of 50% and above. In such a case, it is possible to secure the intensity ratio of the reflected probe laser beam reflected from the bottom and top surfaces of the object to be heated to the incident light of ¼ and above; thus, a temporal change curve data of a reflectivity having a sufficiently large amplitude can be obtained.

In addition, regarding the shape of the object to be heated 10, it is preferable that the object to be heated have the surface area sufficiently larger than the thickness. Having the thermal diffusion length in the planar direction longer than that in the depth direction, and thereby the effect of a heat accumulation effect during heating becoming smaller, such a shape has the advantage that a relatively highly accurate temperature measurement can be conducted. For the same reason, it is preferable that the thickness of the object to be heated be sufficiently larger than the thickness of a thermal treatment layer.

The probe laser beam 20 used in this light intensity measuring unit 100 is not especially limited as long as it is coherent. For example, a He-Ne probe laser beam having an output of 10 mW and a wavelength of 633 nm and a YAG harmonic probe laser beam having an output of 50 mW and a wavelength of 532 nm may be adopted. It is necessary to have an irradiation laser spot sufficiently smaller than the temperature distribution of the object to be heated 10 in the planar direction in order to make an error in temperature measurement smaller. Accordingly, it is preferable to stop down the spot using a lens and the like. However, if a lens having a focal length f which satisfies the relationship with the thickness of an object to be heated d, f<2d, is adopted, the problem arises in which the intensity of the reflected light from the bottom surface of the object to be heated becomes extremely weaker compared to the intensity of the reflected light from the top surface, resulting in the interference amplitude of the reflected light becoming small. Hence, it is preferable to use a lens having a focal length f satisfying the relationship of f>2d.

A heat source for heating the object to be heated 10 is not especially limited. This temperature measuring apparatus can be adopted in a thermal treatment of a substrate and the like with the use of any heat source. However, it is preferable that the temperature measuring apparatus be used for temperature measurement in a thermal treatment in which a substrate, such as a $SiO_2$ substrate and a Si substrate, is rapidly heated in the range of milliseconds with the use of a high power density heat source, such as a plasma jet, a laser, a Xe flash lamp, and a halogen lamp. This is because this temperature measuring apparatus allows measurement of rapidly changing temperature in the range of milliseconds, though such measurement used to be difficult.

The calculation unit 200 in this temperature measuring apparatus may have the following configuration for implementation of the above-described function to acquire a replicated object to be heated. The calculation unit 200 may include, as shown in FIG. 1, a data input section 210, a thermal conduction analysis section 220, a conversion section 230, an optical analysis section 240, a judgment section 250, and a replicated object to be heated output section 260.

The data input section 210 has a function for inputting predetermined input data, such as initial values for calculation and the corrected values thereof. The initial values to be input include dimensional conditions, such as thickness, area, and parallelism of an object to be heated, thermal and optical conditions, such as initial temperature, initial reflectivity, thermal conductivity, density, specific heat, temperature dependency of refractive index, and other conditions, such as type of heat source, input electric power, time profile of electric power input, power transfer efficiency, size of a region in which a virtual object to be heated effectively receives an input electric power.

The thermal conduction analysis section 220 has a function for determining a temperature distribution profile of a virtual object to be heated on the basis of the input data, that is, the function of the temperature characteristic acquisition unit for a virtual object to be heated. The thermal conduction analysis section 220 may be configured based on a program or a software to which a publicly-known thermal conduction analysis method is applied.

The conversion section 230 has a function for converting the temperature distribution profile determined by the thermal conduction analysis section 220 into the corresponding refractive index distribution profile, that is, the function of the refractive index property acquisition unit for a virtual object to be heated. Since a virtual object to be heated has a uniquely defined correlation between temperature and refractive index, a temperature distribution and a temporal change of temperature occurred in the virtual object to be heated can be converted, on the one to one basis, into a refractive index distribution and a temporal change of refractive index, respectively. For example, in the case at temperature T (° C.) with a probe laser beam wavelength of 633 nm, the refractive index n of a quartz substrate can be expressed in the formula, $n=1.457+1.2\times10^{-5}T$, and the refractive index n of a Si substrate can be expressed in the formula, $n=4.04+2.105\times10^{-4}T$.

Hence, it is possible to convert a temperature distribution profile into a refractive index distribution profile based on these formulas.

The optical analysis section 240 has a function for acquiring a predetermined optical property of the virtual object to be heated having the converted refractive index distribution profile obtained by the conversion section 230, that is, the function for acquiring an optical property of the virtual object to be heated (optical structure) having the above-described refractive index distribution property. For example, the optical analysis section 240 functions as a light intensity property acquisition unit for an optical structure, which acquires a light intensity property Y. In this case, the optical property Y can be replaced by an optical thickness property Y associated with the optical thickness (n×d) defined with the thickness d of a substrate irradiated with a probe laser beam and the refractive index n of the substrate. A program or a software in which a publicly-known optical analysis method is applied may be adopted for acquisition of such an optical property.

The judgment section 250 has a function for extracting a predetermined optical property X from the light intensity property X, and for determining the difference between the optical property X thus obtained and the optical property Y acquired by the optical analysis section 240. For example, in the case where a target optical property is a light intensity property, the difference between a light intensity property X acquired in the light intensity measuring unit 100 and a light intensity property Y acquired in the optical analysis section 240 is evaluated. In the case where a target optical property is an optical thickness property, the difference between an optical thickness property X extracted from a light intensity property X obtained in the light intensity measuring unit 100 and an optical thickness property Y acquired in the optical analysis section 240.

Figure 5:
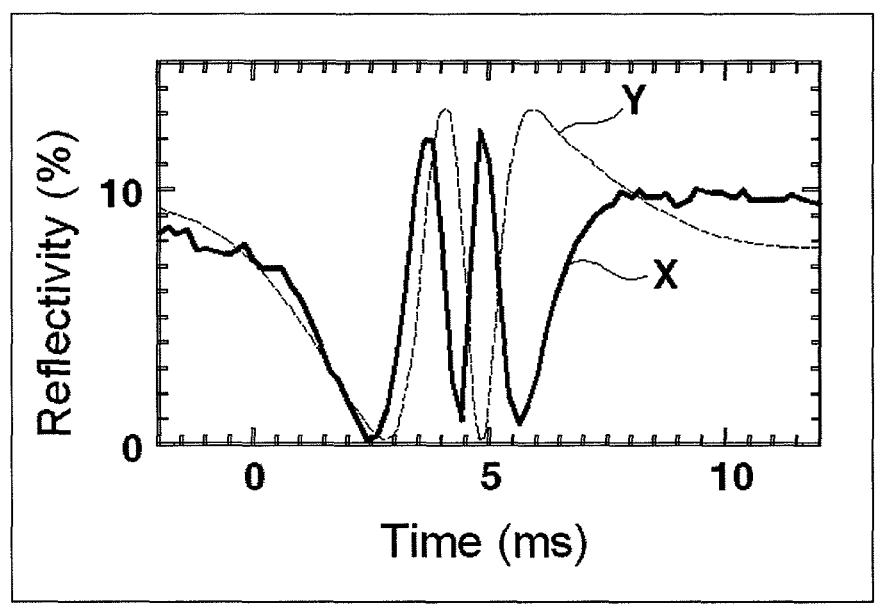
FIG. 5 is a graph showing a light intensity property X shown in FIG. 4 and a light intensity property Y obtained for a virtual object to be heated in superimposition.

To be more specific, the difference between a light intensity property X and a light intensity property Y can be evaluated by making use of oscillation of the waveforms representing these properties. For example, as shown in FIG. 5, the waveform representing the light intensity property X, shown by a solid line and obtained by the light intensity measuring unit 100, and the wave form representing the light intensity property Y, shown by a broken line and obtained by the optical analysis section 240 on the basis of the initial values have generally different frequencies and phases. Focusing on these points, the difference between a light intensity property X and a light intensity property Y is evaluated.

Hence, upon providing the judgment section 250 with a pattern recognition section in which a pattern matching method, a feature-point matching method, or a frequency analysis method is used, differences in frequency and phase between the light intensity property X and the light intensity property Y are extracted and then analyzed by the pattern recognition section; therefore, the differences can be easily evaluated. In general, the larger the temperature increase of an object to be heated is, the higher the frequency becomes, and the smaller the temperature increase is, the lower the frequency becomes. Incidentally, in FIG. 5, the horizontal axis represents time after the initiation of heat treatment, and the vertical axis represents reflectivity.

Figure 6:
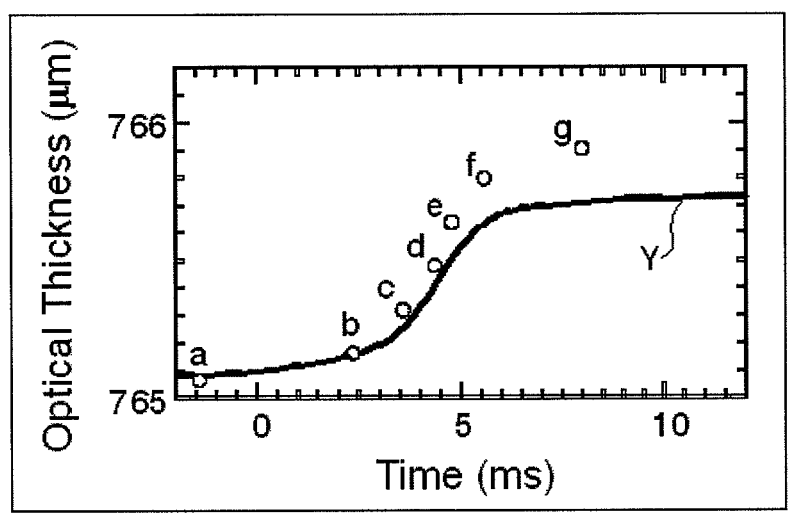
FIG. 6 is a graph showing an optical thickness property Y of a virtual object to be heated.

While the method utilizing a light intensity property follows the above-described processes, a method utilizing an optical thickness property evaluates the difference between an optical thickness property X and an optical thickness property Y in the following process. An optical thickness property Y indicated by a solid line in FIG. 6 is obtained in the optical analysis section 240. In FIG. 6, the horizontal axis represents time after the initiation of heat treatment, and the vertical axis represents optical thickness.

Meanwhile, in the light intensity property X shown in FIG. 4, a peak top and the following valley bottom in the oscillatory waveform, or a valley bottom and the following peak top indicate a change in the optical thickness of an optical structure by $(¼)λ$ (λ is a wavelength of a probe laser beam). Time points in which the optical thickness changes by $λ/4$ were extracted from the waveform representing the light intensity property X shown in FIG. 4, and the extracted time points were plotted on FIG. 6. Open circles in FIG. 6 show the extracted time points. Each of the circles a to g in FIG. 6 shows either a peak top or a valley bottom in the waveform representing the light intensity property X in FIG. 4.

As shown in FIG. 6, the difference between the optical thickness property X and the optical thickness property Y can be easily evaluated by comparing the optical thicknesses thereof at the time points a to g. For example, it is possible to evaluate the difference between the optical thickness properties X and Y by calculating an error of mean square between the optical thicknesses thereof at each of the time points a to g.

Such an evaluation process of difference in optical property by the judgment section 250 is repeated until the difference is minimized. More specifically, upon evaluating the difference between the optical properties X and Y, the judgment section 250 re-inputs a corrected initial value into the data input section so that the difference can be minimized. Thus, an optical property Z having the minimum difference between the optical properties X and Y, that is, an optical property Z closest to the optical property X is obtained. Then, the replicated object to be heated output section 260 acquires a virtual object to be heated having a light intensity property Z and a temperature distribution profile which correspond to an optical structure having the optical property Z thus obtained, and then outputs, as a replicated object to be heated, the virtual object to be heated having such properties to the temperature output unit 300. The replicated object to be heated reproduces therewithin the temperature distribution and the temporal change of the temperature most approximated the temperature distribution and the temporal change of the temperature for the object to be heated.

The temperature output unit 300 acquires temperature at a predetermined position in the object to be heated at a predetermined time (time after the initiation of thermal treatment) on the basis of the replicated object to be heated, and outputs the temperature thus obtained as a measured temperature of the object to be heated.

In the above section, the temperature measuring apparatus according to the present invention has been described. The temperature measuring apparatus of the present invention can suitably perform a temperature measuring method described below. To be more specific, a temperature measuring method according to the present invention includes the following steps. In the first step, an object to be heated having a uniquely defined correlation between temperature and refractive index is irradiated with a probe laser beam, and then a light intensity property X is determined which represents the relationship between time and light intensity of a resulting light from interference of an incident light and a reflected light. In the second step, firstly, a temperature distribution profile of a virtual object to be heated having equivalent dimensional, thermal, and optimal characteristics to those of the object to be heated is determined upon applying on the virtual object to be heated a thermal incidence equivalent to the conditions for heating of the object to be heated. Then, a refractive index distribution profile corresponding to the temperature distribution profile thus determined is acquired. In the meantime, a light intensity property Y is obtained in irradiation of a virtual object to be heated having the refractive index distribution profile thus obtained with a probe laser beam having equivalent characteristics to the above-mentioned probe laser beam, and the difference between the light intensity property Y and the light intensity property X is evaluated. Subsequently, a corrected light intensity property is determined by correcting a predetermined condition among conditions of the thermal incidence applied to the virtual object to be heated. As a result, a virtual object to be heated is acquired as a replicated object to be heated. The acquired virtual object to be heated has a light intensity property Z which is a corrected light intensity property having the minimum difference with the light intensity property X, and a temperature distribution profile corresponding to the light intensity property Z. In the last step, the temperature of the object to be heated at a predetermined position thereon at a predetermined time is acquired on the basis of the temperature distribution profile of the replicated object to be heated.

In this temperature measuring method, a thermal incidence condition to be corrected for obtaining a light intensity property Z having the minimum difference from the light intensity property X, namely a light intensity property Z closest to the light intensity property X, is preferably a power transfer efficiency and/or the size of a region (heat receiving region) in which the virtual object to be heated effectively receives an input electric power. For example, a recalculation is performed upon replacing a power transfer efficiency $\epsilon$ with $\epsilon+\Delta\epsilon$ and a plasma jet width, as the size of a heat receiving region, W with $W+\Delta W$. In this process, it is possible to effectively make the difference between the light intensity properties X and Y.

This temperature measuring method can be suitably conducted by the following program. To be more specific, a temperature measuring program according to the present invention includes the following programs; a program for acquiring a light intensity property X representing a relationship between time and light intensity of a resulting light from interference between an incident light and a reflected light in radiation of a probe laser beam to an object to be heated having a uniquely defined correlation between temperature and refractive index; a thermal conduction analysis program for acquiring a temperature distribution profile when a virtual object to be heated having equivalent dimensional, thermal, and optical characteristics to those of the object to be heated is subjected to a thermal incidence equivalent to the heating conditions for the object to be heated; a program for acquiring a refractive index distribution profile corresponding to the temperature distribution profile; an optical analysis program for acquiring a light intensity property Y, which is obtained when a virtual object to be heated having the refractive index distribution profile is irradiated with a probe laser beam having equivalent characteristics to those of the probe laser beam above; a program for acquiring a light intensity property Z having the smallest difference with the light intensity property X upon evaluating the difference between the light intensity property X and the light intensity property Y, and correcting a predetermined condition among conditions of the thermal incidence to minimize the difference; a program for acquiring, as a replicated object to be heated, a virtual object to be heated having the light intensity property Z and a temperature distribution profile corresponding thereto; and a program for acquiring the temperature of the object to be heated at a predetermined position thereon at a predetermined time on the basis of the temperature distribution profile of the replicated object to be heated.

Furthermore, this program can be recorded in a computer-readable recording media. To be more specific, a computer-readable recording media according to the present invention records the following programs: a program for acquiring a light intensity property X representing a relationship between time and light intensity of a resulting light from interference between an incident light and a reflected light in radiation of a probe laser beam to an object to be heated having a uniquely defined correlation between temperature and refractive index; a thermal conduction analysis program for acquiring a temperature distribution profile at a time when a virtual object to be heated having equivalent dimensional, thermal, and optical characteristics to those of the object to be heated is subjected to a thermal incidence equivalent to the heating conditions for the object to be heated; a program for acquiring a refractive index distribution profile corresponding to the temperature distribution profile; an optical analysis program for acquiring a light intensity property Y which is obtained when a virtual object to be heated having the refractive index distribution profile is irradiated with a probe laser beam having equivalent characteristics to those of the probe laser beam above; a program for acquiring a light intensity property Z having the smallest difference with the light intensity property X upon evaluating the difference between the light intensity property X and the light intensity property Y, and correcting a predetermined condition among conditions of the thermal incidence to minimize the difference; a program for acquiring, as a replicated object to be heated, a virtual object to be heated having the light intensity property Z and a temperature distribution profile corresponding thereto; and a program for acquiring the temperature of the object to be heated at a predetermined position thereon at a predetermined time on the basis of the temperature distribution profile of the replicated object to be heated.

Moreover, it is possible to configure an LSI performing temperature measurement as described below. To be more specific, an LSI performing temperature measurement according to the present invention performs temperature measurement by executing the following programs: a program for acquiring a light intensity property X representing a relationship between time and light intensity of a resulting light from interference between an incident light and a reflected light in radiation of a probe laser beam to an object to be heated having a uniquely defined correlation between temperature and refractive index; a thermal conduction analysis program for acquiring a temperature distribution profile at a time when a virtual object to be heated having equivalent dimensional, thermal, and optical characteristics to those of the object to be heated is subjected to a thermal incidence equivalent to the heating conditions for the object to be heated; a program for acquiring a refractive index distribution profile corresponding to the temperature distribution profile; an optical analysis program for acquiring a light intensity property Y of a interference wave, which is obtained when a virtual object to be heated having the refractive index distribution profile is irradiated with a probe laser beam having equivalent characteristics to those of the probe laser beam above; a program for acquiring a light intensity property Z having the smallest difference with the light intensity property X upon evaluating the difference between the light intensity property X and the light intensity property Y, and correcting a predetermined condition among conditions of the thermal incidence to minimize the difference; a program for acquiring, as a replicated object to be heated, a virtual object to be heated having the light intensity property Z and a temperature distribution profile corresponding thereto; and a program for acquiring the temperature of the object to be heated at a predetermined position thereon at a predetermined time on the basis of the temperature distribution profile of the replicated object to be heated.

The temperature measuring apparatus and the temperature measuring method according to the present invention have been described above. It is preferable to provide a database described below in the configuration of the temperature measuring apparatus or for implementation of the temperature measuring method. With the database provided, it is possible to further shorten the time required from the acquisition of a light intensity property of an object to be heated to the acquisition of the temperature of the object to be heated at a predetermined position thereon at a predetermined time; thus, it is possible to achieve high-speed temperature measurement.

To be more specific, a database according to the present invention includes the following sections: an input section for inputting data for selection of a subject to be measured; a storage section for storing a group of data representing a light intensity property being calculated in advance on the basis of predetermined initial values representing the subject which is able to be input into the input section and on the basis of a corrected value which is obtained by modifying a specific initial value among the initial values, and a group of data representing a replicated object to be heated having a temperature distribution profile corresponding to the above-described data group; and a retrieve section for retrieving a light intensity property Z which is closest to the light intensity property X obtained for the object to be heated from the data groups representing light intensity property and replicated object to be heated by an object to be heated, and for retrieving a replicated object to be heated corresponding to the light intensity property Z.

In the above-described database, the predetermined initial values include: data regarding temperature dependence of an object to be heated in terms of shape, initial temperature, initial reflectivity, thermal conductivity, density, specific heat; data regarding a heat source in terms of type, input power, temporal profile of input power, power transfer efficiency, and size of a heat receiving region; and data regarding a laser used in temperature measurement in terms of output and wavelength. The specific initial value indicates a power transfer efficiency and/or data regarding the width of a plasma jet. Data for selection of a subject to be measured is specifically "quartz substrate," "Si-based substrate," or "quartz substrate and plasma jet scanning speed." Content of the data for selection of a subject to be measured is to be determined according to the necessity of a production field, and the size of database is determined according to the size of the data for selection of a subject to be measured.

A temperature measuring apparatus provided with such a database described above may have a configuration in which the calculation unit 200 in the above-described temperature measuring apparatus is replaced with the database. A temperature measuring apparatus having such a configuration performs temperature measurement in the following manner. When retrieval of data regarding alight intensity property X from the light intensity measuring unit 100 is initiated as an object to be heated is rapidly heated, the retrieve section retrieves a light intensity property Z which is closest to the light intensity property X acquired from the data section. Then, a replicated object to be heated having a temperature distribution profile corresponding to the light intensity property Z is retrieved. Data of the replicated object to be heated can be output almost instantly with very little time lag; thus, it is possible to measure temperature at each moment after heating of the object to be heated using this temperature measuring apparatus. It is also possible to monitor temperature changes at any position of an object to be heated using the temperature measuring apparatus. Moreover, by providing such a database, it is possible to configure a temperature measuring apparatus having a compact and simple structure.

As described above, this temperature measuring apparatus allows precise measurement of temperature on the surface and inside of a substrate where temperature is rapidly changing in the range of milliseconds in a thermal treatment applying a high power density heat source to a semiconductor substrate and the like. Therefore, it is possible to perform a high-quality thermal treatment by providing this temperature measuring apparatus to a thermal treatment apparatus. It is also possible to perform a higher-quality thermal treatment by providing a thermal treatment apparatus with a controller controlling an output of a plasma jet generator according to a signal from this temperature measuring apparatus. In addition, the thermal treatment apparatus thus configured may be provided with a driving unit changing the relative positioning of a plasma jet of the plasma generator and a semiconductor substrate.

EXAMPLE 1

A temperature measuring test was conducted upon applying a quartz substrate having a thickness of 525 μm to a thermal treatment using a plasma jet with the temperature measuring apparatus shown in FIG. 2. A power input and a scanning speed of the plasma jet were 1.67 kW and 700 mm/s, respectively. During the thermal treatment, a He-Ne probe laser beam having an output power of 10 mW and a wavelength of 633 nm was radiated on the quartz substrate perpendicularly from the bottom surface thereof, and a light intensity property was measured which represents the relationship between time and light intensity of a reflected light resulting from interference of the probe laser beam multiply-reflected within the object to be heated. The above-described method utilizing an optical thickness property for acquiring a replicated object to be heated was adopted.

Figure 7:
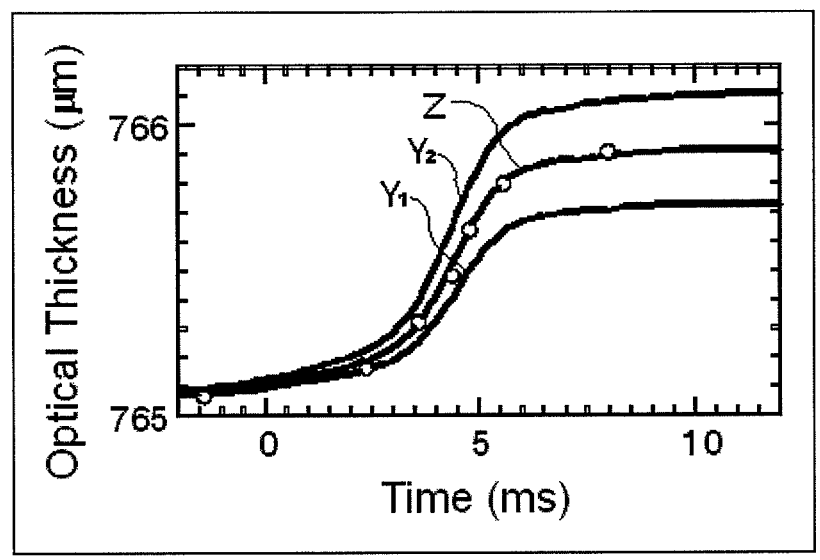
FIG. 7 is a graph in which optical thickness properties $Y_1$, $Y_2$, and Z obtained for a virtual object to be heated and a replicated object to be heated, and an optical thickness property extracted from the light intensity property X shown in FIG. 4.
Figure 8:
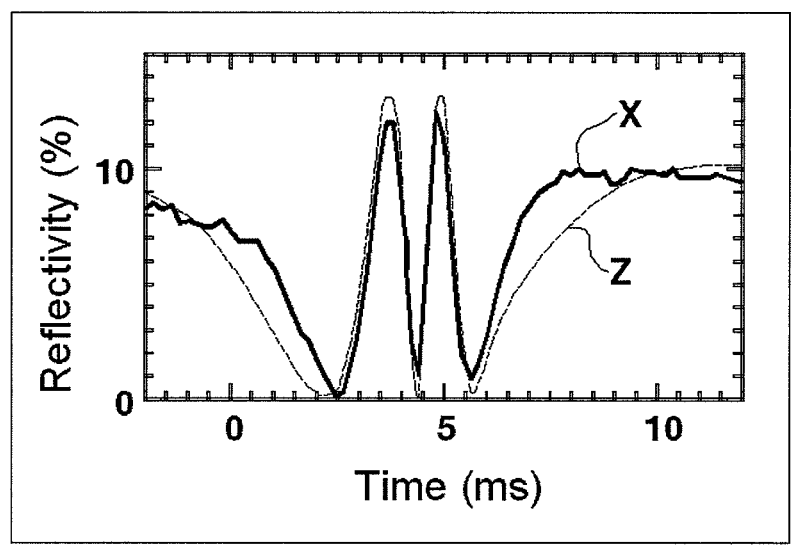
FIG. 8 is a graph showing a light intensity property X shown in FIG. 4 and a light intensity property Z obtained for a replicated object to be heated in superimposition.
Figure 9:
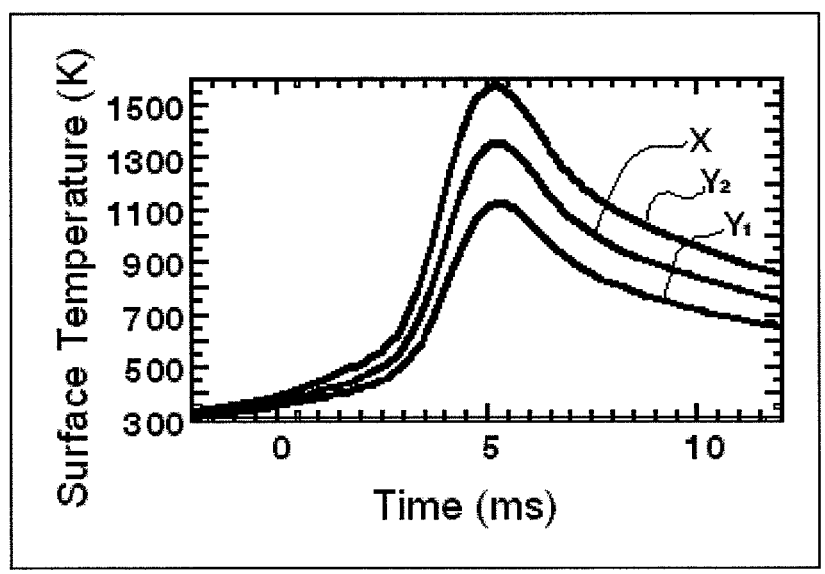
FIG. 9 is a graph showing a temperature distribution profile of a virtual object to be heated and that of a replicated object to be heated.
Figure 10:
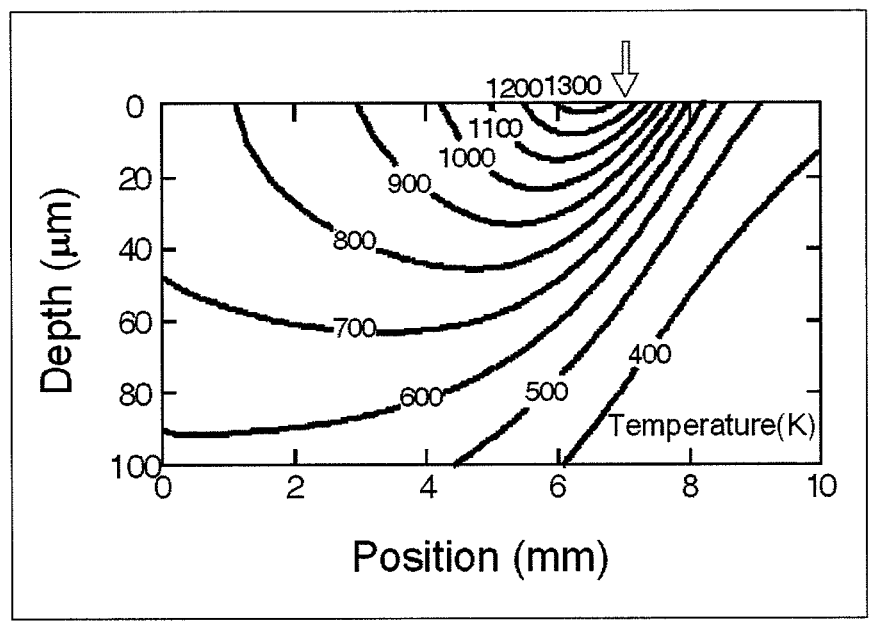
FIG. 10 is a graph showing a temperature distribution profile of a replicated object to be heated 5 ms after the initiation of a thermal treatment of the replicated object to be heated.
Figure 11:
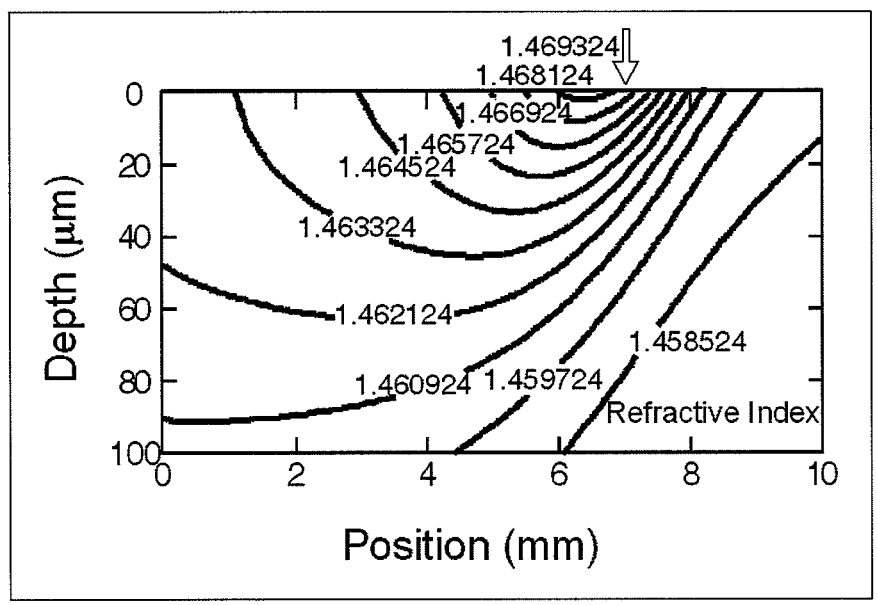
FIG. 11 is a graph showing a refractive index distribution profile of a replicated object to be heated 5 ms after the initiation of a thermal treatment of the replicated object to be heated.

Test results are shown in FIGS. 7 to 11. FIG. 7, which is a graph of the optical thickness property, shows the above-described example in which a replicated object to be heated was acquired based on the optical thickness property. In FIG. 7, the horizontal axis represents time after the initiation of the thermal treatment, and the vertical axis represents optical thickness. In FIG. 8, which is a graph of the light intensity property, the horizontal axis represents time after the initiation of the thermal treatment, and the vertical axis represents reflectivity. In FIG. 9, which is a graph showing the surface temperature of the quartz substrate, the horizontal axis represents time after the initiation of the thermal treatment, and the vertical axis represents the surface temperature. In FIG. 10, which is a graph showing the temperature distribution profile of the replicated object to be heated 5 ms after the initiation of the thermal treatment, the horizontal axis represents the position of the replicated object to be heated, and the vertical axis represents the depth position from the surface of the replicated object to be heated. Each number in the drawing represents temperature, and the arrow indicates the irradiation position of the plasma jet. Incidentally, the scanning with the plasma jet is conducted in a direction from the left to the right of the drawing. FIG. 11 is a graph showing the refractive index distribution profile of the optical structure (replicated object to be heated) in the case where each temperature shown in FIG. 10 was converted based on the following formula regarding temperature and a refractive index of the quartz substrate: $n=1.457+1.2\times 10^{-5}$ T. In FIG. 11, the horizontal axis represents the position of the replicated object to be heated, and the vertical axis represents the depth position from the surface of the replicated object to be heated. Each number in the drawing represents a refractive index, and the arrow shows the radiation position of the plasma jet.

In FIGS. 7 to 9, a reference symbol X represents a property of an object to be heated, that is, the quartz substrate. A reference symbol Y ($Y_1, Y_2$) represents a property of a virtual object to be heated, and a reference symbol Z represents a property of a replicated object to be heated. Circles in FIG. 7 are plots of the optical thickness property (time points of peak tops and valley bottoms of the waveform, and the optical thickness at these time points) extracted from the light intensity property X regarding the object to be heated shown in FIG. 8.

In FIG. 7, the optical thickness property $Y_1$ curve was obtained upon setting a power transfer efficiency to be 45% of the rated value. As shown in FIG. 7, circles are located above the optical thickness property $Y_1$ curve. Therefore, by re-inputting power transfer efficiency set to be 90% of the rated value, and then re-calculating the curve, the optical thickness property $Y_2$ curve was obtained. However, since the optical thickness property $Y_2$ curve thus obtained is located above the circles, further re-input of a power transfer efficiency set to be 64.5% of the rated value, and then re-calculation of the curve were performed to obtain the optical thickness property Z.

In FIG. 7, it is observed that the differences in optical thickness between the circles next to each other among the second to sixth circles are the same ($\lambda/4$). This is related to the light intensity property X in FIG. 8 exhibiting a waveform having clear peaks and clear valleys. It is also observed in FIG. 7 that the circles extracted from the light intensity property X in FIG. 8 correspond well with the Z curve representing the optical thickness property of the replicated object to be heated.

In FIG. 8, it is observed that the waveforms (frequency and phase) of the light intensity property X for the object to be heated and of the light intensity property Z for the replicated object to be heated correspond well with each other. The temperature distribution profile shown in FIG. 9 indicates that the surface temperature of the replicated object to be heated (quartz substrate) reached 1300 K. after 5 ms. Meanwhile, in FIG. 10, it is shown that the temperature distribution has a tree-ring pattern having a position of irradiation with a plasma jet as the core. Furthermore, the temperature of 1000 K. and above is observed at the depth exceeding 20 μm from the surface; thus, it is confirmed that the quartz substrate was sufficiently heat treated. In fact, a microscopic observation of the structure of the quartz substrate verified that the heat treatment of the substrate was of a sufficient level. As observed in the comparison between FIGS. 10 and 11 indicating that temperature and refractive index of the quartz substrate have a direct proportional relationship, it is observed that the temperature distribution pattern and the refractive index distribution pattern have similar shapes (are equivalent).

The invention claimed is:

1. A temperature measuring apparatus, comprising:
   a light intensity measurer configured
   to irradiate, with a probe laser beam, an object to be heated having a uniquely defined correlation between temperature and refractive index, and
   to determine a light intensity property X representing a relationship between time and light intensity of any one of a reflected light and a transmitted light occurring as a result of interference of the probe laser beam multiply-reflected within the object to be heated;

a calculator configured to apply a thermal incidence equivalent to heating conditions for the object to be heated to a virtual object to be heated having dimensional, thermal, and optical characteristics equivalent to dimensional, thermal, and optical characteristics of the object to be heated, and to acquire, as a replicated object to be heated, the virtual object to be heated having a light intensity property Z, which is obtained by irradiating the virtual object to be heated with a probe laser beam having equivalent characteristics to the probe laser beam irradiating the object to be heated and closest to the light intensity property X; and a temperature outputter configured to determine a temperature at a predetermined position on the object to be heated at a predetermined time on the basis of the replicated object to be heated.

2. The temperature measuring apparatus according to claim 1, wherein temperature of the object to be heated is acquired, the temperature varying from room temperature to 3000 K within the time ranging from 1 μs to 10 s.

3. The temperature measuring apparatus according to claim 1, wherein the light intensity measurer includes a probe laser beam source, a beam splitter, a laser condenser lens, and a light intensity detector.

4. The temperature measuring apparatus according to claim 3, wherein the laser condenser lens has the focal length f which fulfills the relationship, f>2d, with d being the thickness of an object to be heated.

5. The temperature measuring apparatus according to claim 1, wherein the calculator includes:

a data inputter configured to input predetermined input data;

a thermal conduction analyzer configured to determine a temperature distribution profile of the virtual object to be heated on the basis of the input data;

a converter configured to convert the determined temperature distribution profile into a corresponding refractive index distribution profile;

an optical analyzer configured to determine a predetermined optical property Y of the virtual object to be heated having the converted refractive index distribution profile;

a judger configured to extract a predetermined optical property X from the light intensity property X, evaluate the difference between the optical properties X and Y, re-input a corrected initial value into the data inputter so that the difference is minimized, and thereby determine an optical property Z closest to the optical property X; and a replicated object to be heated outputter configured to output, as a replicated object to be heated, a virtual object to be heated having the light intensity property Z and a temperature distribution profile which correspond to the optical property Z.

6. The temperature measuring apparatus according to claim 5, wherein the optical property includes any one of an optical thickness property obtained for the virtual object to be heated and a light intensity property obtained for the object to be heated and the virtual object to be heated including a property regarding a frequency, a phase, and peak to valley periods of a waveform.

7. The temperature measuring apparatus according to claim 5, wherein the judger includes a pattern recognizer configured to recognize a difference between the light intensity property X and the light intensity property Y by any one of a pattern matching method, a feature-point matching method, and a frequency analysis method.

8. The temperature measuring apparatus according to claim 5, wherein the judger includes a mean squared error calculator that evaluates a difference between an optical thickness property X of the objected to be heated and the optical thickness property Y of the virtual object to be heated by a mean squared error method.

9. A thermal treatment apparatus comprising a plasma jet generator provided with the temperature measuring apparatus according to claim 1.

10. The thermal treatment apparatus according to claim 9, further comprising a controller which controls an output of the plasma jet generator on the basis of a signal from the temperature measuring apparatus.

11. A temperature measuring method comprising:

irradiating an object to be heated having a uniquely defined correlation between temperature and refractive index with a probe laser beam; and after irradiating, determining a light intensity property X representing a relationship between time and light intensity of any one of a reflected light and a transmitted light occurring as a result of interference of the probe laser beam multiply-reflected within the object to be heated;

acquiring a temperature distribution profile of a virtual object to be heated having dimensional, thermal, and optical characteristics equivalent to dimensional, thermal, and optical characteristics of the object to be heated upon applying, to the virtual object to be heated, a thermal incidence equivalent to the conditions for heating of the object to be heated;

acquiring a refractive index distribution profile corresponding to the temperature distribution profile;

acquiring a light intensity property Y obtained from irradiation of a virtual object to be heated having the refractive index distribution profile with a probe laser beam having equivalent characteristics to the probe laser beam irradiating the object to be heated; and thereby evaluating a difference between the light intensity property Y and the light intensity property X;

after evaluating, acquiring a corrected light intensity property by correcting a predetermined condition among conditions of the thermal incidence applied to the virtual object to be heated; and thereby acquiring, as a replicated object to be heated, a virtual object to be heated having a corrected light intensity property Z, which has a minimum difference with the light intensity property X, and a temperature distribution profile corresponding to the acquired light intensity property Z; and acquiring a temperature at a predetermined position on the object to be heated at a predetermined time on the basis of the replicated object to be heated.

12. The temperature measuring method according to claim 11, wherein the predetermined condition among conditions of the thermal incidence is at least one of a power transfer efficiency and the size of a region in which the virtual object to be heated effectively receives an input power.

13. The temperature measuring method according to claim 11, wherein the temperature at the predetermined position on the object to be heated at the predetermined time is acquired on the basis of the temperature distribution profile of the replicated object to be heated.

14. A non-transitory computer-readable recording medium that stores a program executable by a computer, the program causing the computer to:

acquire a light intensity property X representing a relationship between time and light intensity of any one of a reflected light and a transmitted light occurring as a result of interference of a probe laser beam multiply-reflected within an object to be heated, the probe laser beam multiply-reflected within an object to be heated being caused by radiation of a probe laser beam on the object to be heated having a uniquely defined correlation between temperature and refractive index;

acquire a temperature distribution profile when a virtual object to be heated having dimensional, thermal, and optical characteristics equivalent to dimensional, thermal, and optical characteristics of the object to be heated is subjected to a thermal incidence equivalent to heating conditions for the object to be heated;

acquire a refractive index distribution profile corresponding to the temperature distribution profile;

acquire a light intensity property Y, which is obtained when a virtual object to be heated having the refractive index distribution profile is irradiated with a probe laser beam having characteristics equivalent to characteristics of the probe laser beam irradiating the object to be heated;

acquire a light intensity property Z having the smallest difference with the light intensity property X upon evaluating the difference between the light intensity property X and the light intensity property Y, and correct a predetermined condition among conditions of the thermal incidence to minimize the difference;

acquire, as a replicated object to be heated, a virtual object to be heated having the light intensity property Z and a temperature distribution profile corresponding to the light intensity property Z; and acquire a temperature at a predetermined position on the object to be heated at a predetermined time on the basis of the replicated object to be heated.

15. The non-transitory computer readable recording medium according to claim 14, wherein the temperature at the predetermined position on the object to be heated at the predetermined time is acquired on the basis of the temperature distribution profile of the replicated object to be heated.

16. An LSI (Large Scale Integration), wherein temperature measurement is performed by executing:

acquiring a light intensity property X representing a relationship between time and light intensity of any one of a reflected light and a transmitted light occurring as a result of interference of probe laser beam multiply-reflected within an object to be heated, the probe laser beam multiply-reflected within an object to be heated being caused by radiation of a probe laser beam on the object to be heated having a uniquely defined correlation between temperature and refractive index;

acquiring a temperature distribution profile when a virtual object to be heated having dimensional, thermal, and optical characteristics equivalent to dimensional, thermal, and optical characteristics of the object to be heated is subjected to a thermal incidence equivalent to heating conditions for the object to be heated;

acquiring a refractive index distribution profile corresponding to the temperature distribution profile;

acquiring a light intensity property Y, which is obtained when a virtual object to be heated having the refractive index distribution profile is irradiated with a probe laser beam having characteristics equivalent to characteristics of the probe laser beam irradiating the object to be heated;

acquiring a light intensity property Z having the smallest difference with the light intensity property X upon evaluating the difference between the light intensity property X and the light intensity property Y, and correcting a predetermined condition among conditions of the thermal incidence to minimize the difference;

acquiring, as a replicated object to be heated, a virtual object to be heated having the light intensity property Z and a temperature distribution profile corresponding to the light intensity property Z; and acquiring a temperature at a predetermined position on the object to be heated at a predetermined time on the basis of the replicated object to be heated.

17. The LSI according to claim 16, wherein the temperature at the predetermined position on the object to be heated at the predetermined time is acquired on the basis of the temperature distribution profile of the replicated object to be heated.

18. A database comprising:

an inputter configured to input data having dimensional, thermal and optical characteristics with respect to an object to be heated, for selection of a subject to be measured;

a storage configured to store a group of data representing a light intensity property being calculated in advance on the basis of predetermined initial values of the subject being able to be input into the inputter, and on the basis of a corrected value which is obtained by modifying a specific initial value of the initial values, and a group of data representing a replicated object to be heated having a temperature distribution profile corresponding to the group of data representing the light intensity property; and a retriever configured to retrieve a light intensity property Z which is closest to a light intensity property X obtained for the object to be heated, from the groups of data representing light intensity property and replicated object to be heated, and to retrieve a replicated object to be heated corresponding to the light intensity property Z.

19. A temperature measuring apparatus comprising:

a light intensity measurer configured to irradiate, with a probe laser beam, an object to be heated having a uniquely defined correlation between temperature and refractive index, and to determine a light intensity property X representing a relationship between time and light intensity of any one of a reflected light and a transmitted light occurring as a result of interference of the probe laser beam multiply-reflected within the object to be heated;

a database;

the database including:

an inputter configured to input data having dimensional, thermal and optical characteristics with respect to the object to be heated, for selection of a subject to be measured;

a storage configured to store a group of data representing a light intensity property being calculated in advance on the basis of predetermined initial values of the subject being able to be input into the inputter, and on the basis of a corrected value which is obtained by modifying a specific initial value of the initial values, and a group of data representing a replicated object to be heated having a temperature distribution profile corresponding to the group of data representing the light intensity property; and a retriever configured to retrieve a light intensity property Z which is closest to the light intensity property X obtained for the object to be heated, from the groups of data representing light intensity property and replicated object to be heated, and to retrieve a replicated object to be heated corresponding to the light intensity property Z; and a temperature outputter configured to determine temperature at a predetermined position on the object to be heated at a predetermined time on the basis of the replicated object to be heated.

\* \* \* \* \*